United States Patent
Koenen et al.

(10) Patent No.: US 7,333,174 B2
(45) Date of Patent: Feb. 19, 2008

(54) LITHOGRAPHIC APPARATUS AND METHOD FOR DETERMINING Z POSITION ERRORS/VARIATIONS AND SUBSTRATE TABLE FLATNESS

(75) Inventors: Willem Herman Gertruda Anna Koenen, Roermond (NL); Arthur Winfried Eduardus Minnaert, Veldhoven (NL); Luberthus Ouwehand, JJ's-Hertogenbosch (NL); Johannes Mathias Theodorus Antonius Adriens, Eindhoven (NL); Wouter Onno Pril, Eindhoven (NL)

(73) Assignee: ASML Netherlands, B.V., Veldhoven (NL)

( * ) Notice: Subject to any disclaimer, the term of this patent is extended or adjusted under 35 U.S.C. 154(b) by 0 days.

(21) Appl. No.: 11/317,230

(22) Filed: Dec. 27, 2005

(65) Prior Publication Data
US 2006/0170892 A1 Aug. 3, 2006

Related U.S. Application Data

(63) Continuation-in-part of application No. 11/020,552, filed on Dec. 27, 2004, now abandoned.

(51) Int. Cl.
*G03B 27/42* (2006.01)
*G03B 27/58* (2006.01)
*G03B 27/32* (2006.01)
(52) U.S. Cl. .............................. 355/53; 355/72; 355/77
(58) Field of Classification Search .................. 355/53, 355/55, 72, 77; 356/399, 400, 401, 601
See application file for complete search history.

(56) References Cited

U.S. PATENT DOCUMENTS 4,784,490 A 11/1988 Wayne
(Continued)

FOREIGN PATENT DOCUMENTS

EP 1 357 435 A1 10/2003
(Continued)

OTHER PUBLICATIONS

U.S. Appl. No. 10/899,295, filed Oct. 27, 2005, Loopstra et al.
(Continued)

*Primary Examiner*—Alan Mathews
(74) *Attorney, Agent, or Firm*—Pillsbury Winthrop Shaw Pittman LLP

(57) ABSTRACT

A lithographic projection apparatus including an illumination system configured to provide a beam of radiation, a support configured to support a patterning device, the patterning device configured to impart the beam with a pattern in its cross section, a substrate table configured to hold a substrate, a projection system configured to project the patterned radiation onto a target portion of the substrate, a plurality of level sensors for sensing a level of a substrate carried on the substrate table at a plurality of different positions, and a system for determining the position of the substrate table. Also provided is a controller that is configured to cause relative movement between the substrate and the level sensor array from a first position at which a first measurement is taken to a plurality of overlapping positions at which further measurements are taken, and a calculator for calculating a measure of Z position errors and/or substrate table unflatness and/or a measure of the level sensor position/offset using the plurality of overlapping measurements.

25 Claims, 8 Drawing Sheets

U.S. PATENT DOCUMENTS

| | | | |
|---|---|---|---|
| 5,907,405 A | 5/1999 | Mizutani et al. | |
| 6,208,407 B1* | 3/2001 | Loopstra | 355/53 |
| 6,674,510 B1 | 1/2004 | Jasper et al. | |
| 6,721,389 B2 | 4/2004 | Van Der Werf et al. | |
| 6,906,785 B2 | 6/2005 | Queens et al. | |
| 6,975,407 B1* | 12/2005 | Wang et al. | 356/601 |
| 6,987,555 B2* | 1/2006 | Teunissen et al. | 355/53 |
| 7,072,024 B2* | 7/2006 | Novak | 355/53 |
| 2002/0037461 A1 | 3/2002 | Van Der Werf et al. | |
| 2004/0080737 A1 | 4/2004 | Jasper et al. | |
| 2004/0130691 A1 | 7/2004 | Boonman et al. | |
| 2004/0189964 A1 | 9/2004 | Nijmeijer et al. | |
| 2005/0134816 A1* | 6/2005 | Modderman et al. | 355/53 |
| 2005/0168714 A1 | 8/2005 | Renkens et al. | |

FOREIGN PATENT DOCUMENTS

| | | |
|---|---|---|
| TW | 490596 B | 6/2002 |
| TW | 527527 B | 4/2003 |
| TW | 594447 | 6/2004 |

OTHER PUBLICATIONS

Australian Written Opinion and Search Report issued in SG Application No. 200508364-7 mailed Feb. 7, 2007.

Taiwanese Search Report issued in Taiwanese Patent Application No. 094146564 completed Jan. 14, 2007.

* cited by examiner

LITHOGRAPHIC APPARATUS AND METHOD FOR DETERMINING Z POSITION ERRORS/VARIATIONS AND SUBSTRATE TABLE FLATNESS

This is a continuation-in-part of U.S. application Ser. No. 11/020,552 filed on Dec. 27, 2004, now abandoned which is hereby incorporated by reference in its entirety.

BACKGROUND OF THE INVENTION

1. Field of the Invention

The present invention relates to a lithographic apparatus and method for determining a measure of Z position errors/variations and/or a measure of substrate table (or "chuck") flatness.

2. Description of the Related Art

A lithographic apparatus is a machine that applies a desired pattern onto a target portion of a substrate. Lithographic apparatus can be used, for example, in the manufacture of integrated circuits (ICs). In this case, a patterning device, which is alternatively referred to as a mask or a reticle, may be used to generate a circuit pattern corresponding to an individual layer of the IC. This is done using a projection system that is between the reticle and the substrate and is provided to image an irradiated portion of the reticle onto a target portion of a substrate. The projection system includes components to direct, shape and/or control a beam of radiation. The pattern can be imaged onto the target portion (e.g. including part of one, or several, dies) on a substrate, for example a silicon wafer, that has a layer of radiation-sensitive material, such as resist. In general, a single substrate contains a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction, usually referred to as the "scanning" direction, while synchronously scanning the substrate parallel or anti-parallel to this direction.

In such a lithographic apparatus, an interferometer might be used for measuring displacements with a high accuracy. U.S. Pat. No. 4,784,490, the contents of which are incorporated herein by reference, discloses a typical high stability plane mirror interferometer. The interferometer (also sometimes called interferometer system) comprises a polarizing beam splitter for splitting a beam into a measurement beam and a reference beam, a reference mirror and a measurement mirror for reflecting the reference beam and the measurement beam respectively, and a phase detector for detecting the beam resulting from interference between the measurement beam and the reference beam. By displacement of the measurement mirror, a total length of a measurement path that is travelled by the measurement beam is altered, which results in a phase shift at the phase detector. Using the detected phase shift, it is possible to determine the displacement of the mirror.

Although interferometer systems can provide highly accurate measurements, a problem is that measurement errors occur due to unflatness of the measurement mirror. When the measurement mirror is displaced in a direction perpendicular to the measurement beam, the measurement beam will touch the mirror at a different area on the mirror. Unflatness of the mirror thus results in an error in the distance measurement by the interferometer.

Mirror unflatness is a particular problem when an interferometer system is used in combination with an array of level sensors in order to determine both the x and z positions of the substrate table and the height of the wafer that is on it. In this case, measuring the x and z positions is typically done using appropriately positioned X and Z mirrors. Measuring the level of the wafer surface is done using the level sensors. Using the Z-mirror position and the wafer level, it is possible to determine an absolute measure of the wafer height, on the assumption that the wafer height can be expressed as the difference between the vertical position of the wafer surface and the vertical position of the substrate table, i.e. wafer height=(vertical position of wafer surface-vertical position of substrate). An arrangement of this type is described in more detail in U.S. Pat. No. 6,674,510, the contents of which are fully incorporated herein by reference.

Problems with this arrangement can arise because when two level sensors positioned at different x-positions (such as an optical level sensor and an air gauge) are used to measure a single wafer point the wafer table has to be moved so that wafer point is moved from a position at which it can be measured by the first sensor to a position at which it can be measured by the second sensor. This means that different substrate table x-positions are applied. Hence, different positioning errors result for the two measurements. Because the wafer itself may not be flat, differences in the x-position may mean that the second level sensor measurement is taken at an x-position that has a different level to that of the previous measurement. This is turn means that the measurement radiation will be incident on the Z-mirror at a different position. Because the Z-mirror may not be perfectly flat, the wafer height (which is dependent on the Z-mirror vertical position) may be incorrectly calculated. Hence, in order to compare the results of the measurements an absolute Z-mirror map on the measurement side is required to correct for mirror errors.

SUMMARY OF THE INVENTION

It is an aspect of the present invention to alleviate, at least partially, the problems discussed above.

According to a first aspect of the present invention, there is provided a lithographic projection apparatus including:

an illumination system configured to provide a beam of radiation;

a substrate table configured to hold a substrate;

a system for determining the position of the substrate table in a Z-direction;

a plurality of level sensors for sensing a level of a substrate carried on the substrate table at a plurality of different positions;

a controller configured to cause relative movement between the substrate table and the level sensor array, so that each of a plurality of the level sensors is movable into a position to make a measurement at a first point on the substrate, thereby to provide a set of overlapping measurements, the plurality of level sensors being movable to at least one other measurement point on the substrate, thereby to provide another set of overlapping measurements, and a calculator for calculating at least one of a measure of position errors/variations, a measure of substrate table unflatness and a measure of the level sensor position/offset using the sets of overlapping level sensor measurements.

By using a series of overlapping level sensor measurements, it is possible to estimate position errors, in particular Z position errors, substrate table flatness, and level sensor position/offset. This can be done with a high degree of accuracy and reproducibility. All of these can be determined from the overlapping level sensor measurements.

The position errors may be any one or more of Z-position, Y-position, X-position, rotational position relative to the X-axis and rotational position relative to the Y-axis.

The system for determining the position of the substrate table may include a Z-mirror for use in determining the Z position. Each level measured by the level sensors may be assumed to be a function of Z-mirror height, substrate height and level sensor spot offset error. The calculator may be configured to calculate at least one of the measure of Z-position errors; the measure of substrate table unflatness and the measure of the level sensor position/offset by solving a series of simultaneous equations that each equate a level sensor measurement to a function of Z-mirror height, substrate height and level sensor spot offset error.

The system for determining Z-position may include an encoder. Each level measured by the level sensors may be a function of the height of at least part of the encoder, substrate height and level sensor spot offset error.

The level sensor array may be a linear array of level sensors. The sensors of the array may be separated by a constant pitch. The controller may be configured to cause relative movement of an amount that corresponds to the sensor pitch, thereby to ensure measurement overlap. The level sensor array may include a plurality of different level sensors.

The system for determining the position of the substrate table may optionally include at least one interferometer. Additionally or alternatively, the system for determining the position of the substrate table may include at least one mirror for directing radiation from the at least one interferometer onto the Z-mirror.

The illumination system may include a radiation source. The radiation source may be a volume-radiating source. The radiation source may include a plasma radiation source. The plasma radiation source may be an electrical discharge source or a laser produced plasma source. The radiation source may also be operable to emit radiation in the EUV range. Plasma sources are at least optically transparent between radiation pulses.

The apparatus may further include a support configured to support a patterning device, the patterning device configured to impart the beam with a pattern in its cross section.

The apparatus may further include a projection system configured to project the patterned radiation onto a target portion of the substrate.

According to another aspect of the invention, there is provided a method in a lithographic system that has an illumination system configured to provide a beam of radiation; a substrate table configured to hold a substrate; a system for determining the position of the substrate table in a Z-direction, and a plurality of level sensors for sensing a level of a substrate carried on the substrate table at a plurality of different positions, the method involving:

causing relative movement between the substrate and the level sensor array, so that each of a plurality of the level sensors is movable into a position to make a measurement at a first point on the substrate, thereby to provide a first set of overlapping measurements, causing relative movement between the substrate and the level sensor array to move the plurality of level sensors to at least one other measurement point on the substrate, thereby to provide at least one other set of overlapping measurements, and calculating a measure of Z position error and/or substrate table unflatness and/or a measure of a level sensor position/offset using the sets of overlapping measurements.

The position errors may be any one or more of Z-position, Y-position, X-position, rotational position relative to the X-axis and rotational position relative to the Y-axis.

The level sensor array may be a linear array of level sensors. The sensors of each array may be separated by a constant pitch. The relative movement may be of an amount that corresponds to the sensor pitch, thereby to ensure measurement overlap.

The illumination system may include a radiation source. The radiation source may be a volume radiation source. The radiation source may be a plasma radiation source. The plasma radiation source may be an electrical discharge plasma source or a laser stimulated plasma source. The radiation source may be operable to emit radiation in the EUV range.

According to another aspect of the present invention, there is provided a computer program on a data carrier or a computer readable medium, or a computer program product, the computer program or computer program product having code or instructions configured to:

cause relative movement between the substrate and the level sensor array so that each of a plurality of the level sensors is movable into a position to make a measurement at a first point on the substrate, thereby to provide a first set of overlapping measurements, cause relative movement between the substrate and the level sensor array to move the plurality of level sensors to at least one other measurement point on the substrate, thereby to provide at least one other set of overlapping measurements, and calculate a measure of position error and/or substrate table unflatness and/or a measure of a level sensor position/offset using the sets of overlapping measurements.

The position errors may be any one or more of Z-position, Y-position, X-position, rotational position relative to the X-axis and rotational position relative to the Y-axis.

According to another aspect of the present invention, there is provided a device that is made directly or indirectly using the lithography system and/or device manufacturing method and/or computer program of any of the preceding aspects of the invention.

According to still another aspect of the invention, there is provided a method for calibrating a lithographic apparatus comprising: using at least one of a measure of position errors; a measure of substrate table unflatness and a measure of level sensor position/offset as determined using the apparatus, method or computer program of any of the other aspects of the invention.

The terms "radiation" and "beam" used herein encompass all types of electromagnetic radiation, including ultraviolet (UV) radiation (e.g. having a wavelength of 365, 248, 193, 157 or 126 nm) and extreme ultraviolet (EUV) radiation (e.g. having a wavelength in the range of 5-20 nm), as well as particle beams, such as ion beams or electron beams.

The term "patterning device" used herein should be broadly interpreted as referring to a device that can be used to impart to a beam of radiation a pattern over its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive/transparent or reflective. The patterning device may include any of masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support, e.g. bears the weight of, the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support may be a frame or a table, for example, which may be fixed or movable as required and which may ensure that the patterning device is at a desired position, for example with respect to the projection system. Any use of the terms "reticle" or "mask" herein may be considered synonymous with the more general term "patterning means".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components to direct, shape, and/or control the beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION OF THE DRAWINGS

Figure 1:
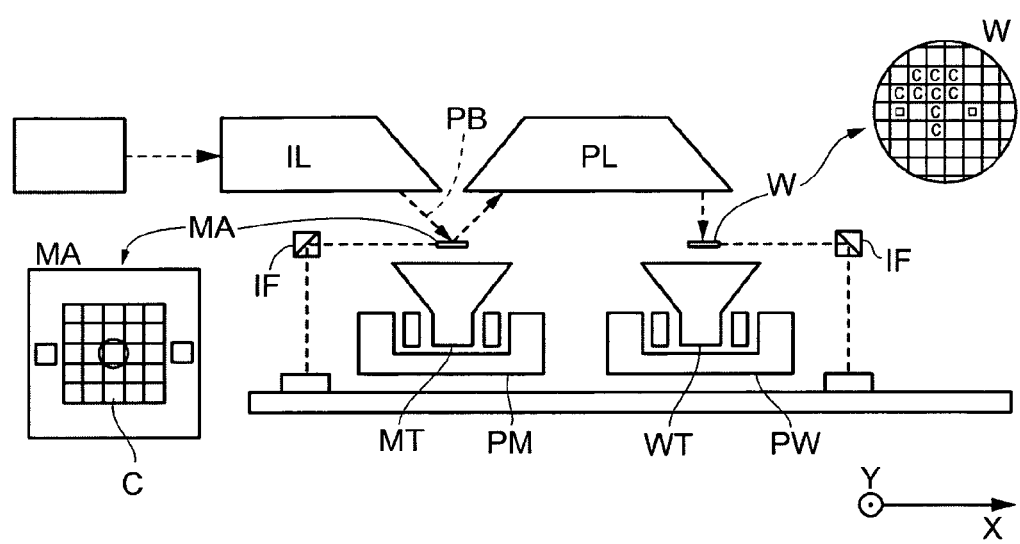
FIG. 1 is a schematic diagram of a lithographic apparatus according to the present invention.

FIG. 1 shows an apparatus including an illumination system (illuminator) IL configured to provide a beam PB of radiation (e.g. UV or EUV radiation). A first support (e.g. a mask table) MT is configured to support a patterning device (e.g. a mask) MA and is connected to a first positioning device PM that accurately positions the patterning device with respect to a projection system ("lens") PL. A substrate table (e.g. a wafer table) WT is configured to hold a substrate (e.g. a resist-coated wafer) and is connected to a second positioning device that accurately positions the substrate with respect to the projection system PL. The projection system (e.g. a reflective projection lens) PL is configured to image a pattern imparted to the beam PB by the patterning device MA onto a target portion C (e.g. including one or more dies) of the substrate W. The apparatus of FIG. 1 is of a reflective type, for example employing a reflective mask or a programmable mirror array of a type as referred to above. However, it will be appreciated that the apparatus may be of a transmissive type, for example employing a transmissive mask.

The illuminator IL receives radiation from a radiation source SO. The source and the lithographic apparatus may be separate entities, for example when the source is a plasma discharge source. In such cases, the source is not considered to form part of the lithographic apparatus and the radiation is generally passed from the source SO to the illuminator IL with the aid of a radiation collector, including for example suitable collecting mirrors and/or a spectral purity filter. In other cases, the source may be an integral part of the apparatus, for example when the source is a mercury lamp.

The illuminator IL may include an adjusting device configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation PB having a desired uniformity and intensity distribution in its cross-section. This beam PB is incident on the mask MA, which is held on the mask table MT. Being reflected by the mask MA, the beam PB passes through the projection system PL, which focuses the beam onto a target portion C of the substrate W. With the aid of the second positioning device PW and a position sensor IF2 (e.g. an interferometric device), the substrate table WT can be moved accurately, e.g. so as to position different target portions C in the path of the beam PB. Similarly, the first positioning device PM and a position sensor IF1 (e.g. an interferometric device) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in various modes. For example, in step mode, the mask table MT and the substrate table WT are kept essentially stationary, while an entire pattern imparted to the projection beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

In a scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations on the various modes described or entirely different modes of use may also be employed.

Figure 2:
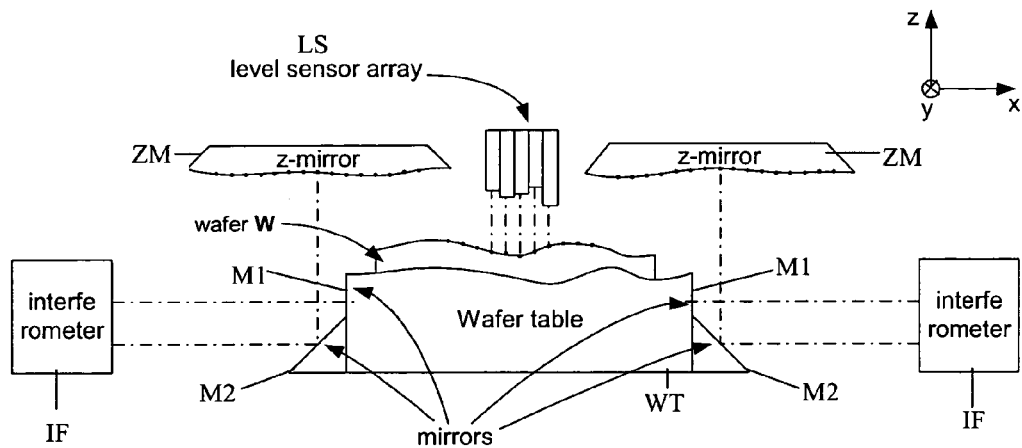
FIG. 2 is a more detailed view of parts of the apparatus of FIG. 1.

FIG. 2 shows a system for determining the position of a wafer on the wafer/substrate table WT or "chuck" as it is sometimes referred to in the art. This includes two interferometers IF, one on each of opposite sides of the substrate table WT. Each interferometer IF is positioned to direct measurement radiation onto one of a first pair of mirrors M1 that are provided on opposing sidewalls of the table, these mirrors M1 being substantially perpendicular to the radiation emitted from the associated interferometer IF. These will be referred to as the X-mirrors M1. In addition, each interferometer IF is positioned to direct measurement radiation onto one of a second pair of mirrors M2 that are angled at 45 degrees to the direction of propagation of radiation from the interferometer IF. These mirrors M2 are provided on opposing sidewalls of the table WT. These will be referred to as the angled mirrors M2.

The X-mirrors M1 and the angled mirrors M2 are carried on the wafer table WT and so move when the table WT is moved. Radiation reflected from each X-mirror M1 is directed back to its associated interferometer IF and can be used to determine the x-position of the wafer table WT. Radiation reflected from the angled mirrors M2 is directed onto one of a pair of Z-mirrors ZM positioned above the level of the wafer table WT and then subsequently reflected back to the interferometer IF. The dots that are shown on the Z-mirrors ZM of FIG. 2 are indicative of the positions where the interferometer IF beams reside during measurements. By using radiation reflected from each Z-mirror ZM in combination with a measure of the x-position determined using the X-mirrors M1, it is possible to obtain an indirect measure of the height of the Z-mirror ZM and so the wafer table WT.

Directly above the wafer table WT is an array of level sensors LS. This can include a number of different sensor types such as optical level sensors and the air gauges. The dots shown on the wafer represent the positions where the level sensors LS measure height. In the particular example shown in FIG. 2, the array of level sensors LS is linear and includes five sensors, and the number of measurement points N is eleven. Of course, it will be appreciated that different numbers of sensors and/or array configurations could be used, as well as different numbers of measurement points.

Figure 3:
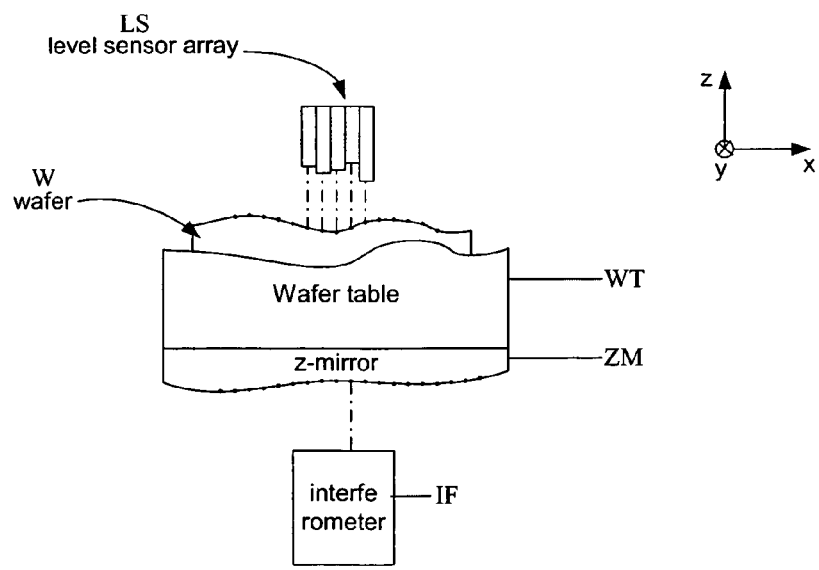
FIG. 3 is another representation of the apparatus of FIG. 2.

FIG. 3 shows an alternative arrangement for measuring the level of a wafer and equally the wafer table height. In this case, the Z-mirror ZM is directly mounted on the back of the wafer table WT and so can give direct measure of the wafer table height. In practice, however, implementing this can be difficult, because typically the wafer table WT movement mechanism is provided at the rear of the table.

In order to determine an absolute mirror map, the x-position of the wafer table WT is monitored using the interferometers IF and a plurality of level sensor LS measurements is performed at various different x-positions across the wafer. Each level sensor measurement may optionally be static. In this case, typically each level sensor would take a number of measurements at each measurement point and provide an average value, thereby to reduce the effects of noise. In a typical example, each level sensor may take six hundred readings at a single point, although different sensors may be configured to take different numbers of readings and indeed different numbers of readings may be taken at different positions of the substrate table. As will be appreciated, whilst increasing the number of measurements reduces the effects of noise, it also increases the measurement time. Hence, there is a trade off between calibration time and measurement accuracy. As an alternative to a static measurement, the wafer table WT may be moved along the direction of the level sensor array LS, whilst the level sensor array LS is taking measurements. Measurements relating to specific points of the wafer may be obtained by sampling the sensor outputs at appropriate times. In this case, the number of measurements that are taken at each point will typically be lower than for the static measurement, and may be only one.

Figure 4:
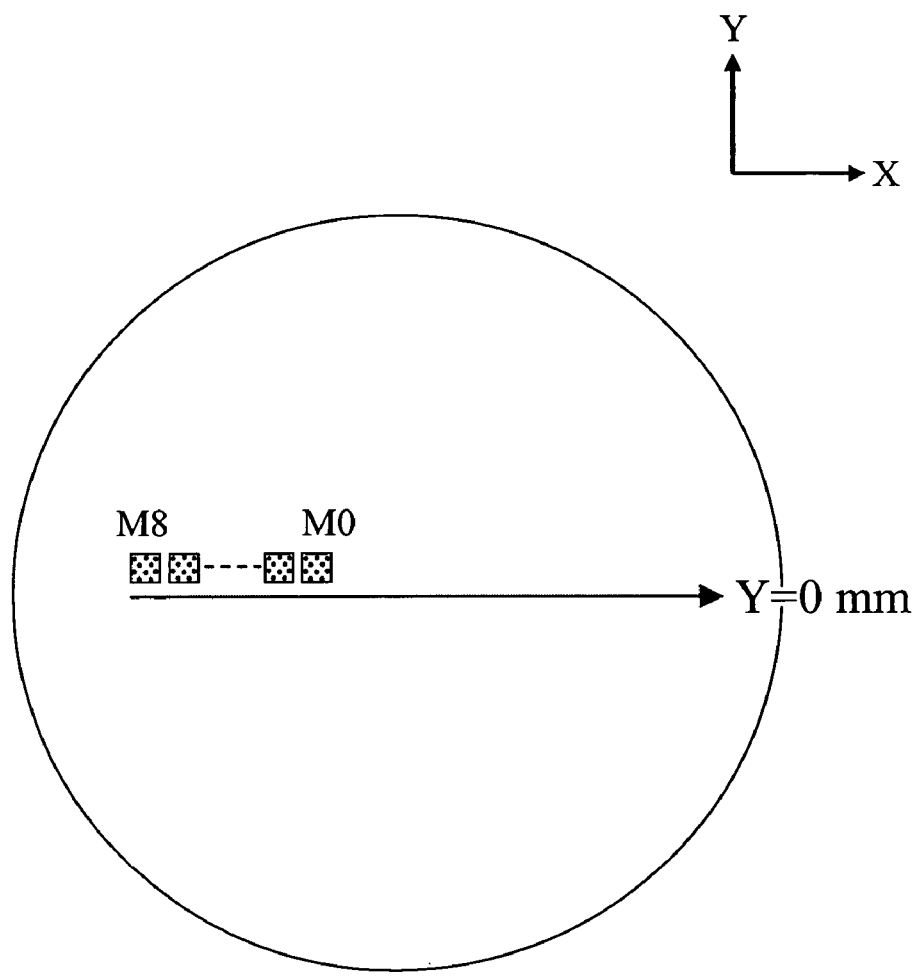
FIG. 4 is a schematic view of a level sensor array sensing the level of a wafer on a chuck at three different Y positions.

In the example shown in FIG. 2, the wafer table WT is movable using a controller (not shown). In particular, the wafer table WT is moved parallel to the X-axis in steps from the extreme left position to the extreme right position. After each step, all level sensors covering a target wafer point take a measurement. As a result, each wafer point is measured once by each level sensor. Given N wafer points and M level sensors this produces NM measurements. If N>M, then there are N+M−1 wafer table positions. Starting with the sensor array at the left-most position of the wafer table, only the rightmost level sensor covers a wafer point. At the next step, 2 level sensor spots cover a wafer point and so on. This means that for position $1 \leq n \leq M$, n level sensors cover a wafer point; for position $M \leq n \leq N$, M level sensors cover a wafer point; and for position $N \leq n \leq N+M$, (M+N−n) level sensors cover a wafer point. This adds up to NM measurements. In this way, by moving the sensor array LS relative to the wafer W, a series of overlapping LS measurements is obtained. This series or sequence of measurements may optionally be repeated for three different Y positions on the wafer (for example −100, 0 and 100 mm) as indicated in FIG. 4, although in principle, the measurement at Y=0 m should be accurate enough for a Z-mirror map. It should be noted that complete overlapping of the measurement sites is not essential. For stitching, the pitch has to be: 0<pitch_measurements<pitch_LS_spots. In the event that the overlap of measurements is not perfect, this can be dealt with by linear interpolation of the measurements or mathematical fitting of parameters describing the maps and the wafer.

Various components contribute to a level sensor measurement at an arbitrary X, Y position, including mirror unflatness, wafer unflatness, chuck table unflatness, and level sensor spot offset errors. Consequently, a general expression for a level sensor LS measurement on a point on the wafer substrate WS for a given wafer loading orientation is:

$$V_{meas}(x_{WS}, y_{WS}) = dZ(X,Y) - x_{LS}dRy(X,Y) + c_{true}(x_{WS}, y_{WS}) + W_{true}(x_{waf}, y_{waf}) + dz_{LS}(x_{LS})$$

where $v_{meas}$ is the measured wafer thickness/height, dZ at Ry and dRy are the stage Z and Ry position error due to mirror unflatness, respectively, where Ry is the rotational position of the wafer relative to the y axis, $c_{true}$ and $w_{true}$ are the true height/unflatness of the chuck and wafer as a function of the x and y positions of the wafer, respectively, $x_{LS}$ is the x position of the LS spot and $dz_{LS}$ is the z error of the spot height.

For the stage position measurement system as in FIGS. 2 and 3, dZ(X,Y) and dRy(X,Y) can be represented by independent one-dimensional maps, i.e. dZ(X,Y)=dZx(X)+dZy(Y) and dRy(X,Y)=dRyx(X)+dRyy(Y). It should be noted that dZx and dRyx are functions of the unflatness of the so-called z mirrors. Also, dRyx, dRyy, dZy and dRyy are functions of the unflatness of the so-called 45 degrees mirrors. So the above equation becomes:

$$v_{meas}(x_{WS}, y_{WS}) = dZx(X) + dZy(Y) - x_{LS}dRyx(X) - x_{LS}dRyy(Y) + c_{true}(x_{WS}, y_{WS}) + w_{true}(x_{waf}, y_{waf}) + dz_{LS}(x_{LS})$$

Stage position, position on the wafer stage and position of the level sensor spot are related to each other in the following way:

$$\begin{pmatrix} x_{LS} \\ y_{LS} \end{pmatrix} = \begin{pmatrix} x_{WS} \\ y_{WS} \end{pmatrix} - \begin{pmatrix} X \\ Y \end{pmatrix}$$

Assuming that yLS=0 for all spots, for measuring one line in the x direction over the wafer and for one wafer rotation, the above equation reduces to:

$$v_{meas}(x_{WS}) = dZx(X) - x_{LS}dRy(X) + v_{true}(x_{WS}) + dz_{LS}(x_{LS})$$

where $v_{true}$ represents the combined effect of $c_{true}$ and $w_{true}$, i.e. of chuck and wafer. For one wafer load angle there is a fixed relation between a position in WS coordinates and in wafer coordinates. Furthermore, for measuring one line in x direction, the y direction does not play a role, i.e. only leads to a constant contribution.

For a line of measurements in x direction with a nine spot level sensor and with a measurement pitch equal to the pitch of the level sensor spots, then:

$$v_1 = dZx_{-N} - x_{LS,-4}dRyx_{-N} + cw_{-N-4} + dz_{LS,-4}$$
$$v_2 = dZx_{-N} - x_{LS,-3}dRyx_{-N} + cw_{-N-3} + dz_{LS,-3}$$
$$\vdots$$
$$v_9 = dZx_{-N} - x_{LS,4}dRyx_{-N} + cw_{-N+4} + dz_{LS,4}$$
$$v_{10} = dZx_{-N+1} - x_{LS,-4}dRyx_{-N+1} + cw_{-N-3} + dz_{LS,-4}$$
$$v_{11} = dZx_{-N+1} - x_{LS,-3}dRyx_{-N+1} + cw_{-N-2} + dz_{LS,-3}$$
$$\vdots$$
$$v_{18} = dZx_{-N+1} - x_{LS,4}dRyx_{-N+1} + cw_{-N+5} + dz_{LS,4}$$
$$\vdots$$
$$v_{2N*9+1} = dZx_N - x_{LS,-4}dRyx_N + cw_{N-4} + dz_{LS,-4}$$
$$v_{2N*9+2} = dZx_N - x_{LS,-3}dRyx_N + cw_{N-3} + dz_{LS,-3}$$
$$\vdots$$
$$v_{(2N+1)*9} = dZx_N - x_{LS,-4}dRyx_N + cw_{N+4} + dz_{LS,4}$$

where $v_{1 to 9}$ etc are sets of measurements taken by each of the nine level sensors at a single measurement point, there being (2*N+1)*9 measurement points in total. It should be noted that these equations only take into account points on the wafer that are measured by all level sensors. Hence, measurements for extreme positions of x where only one or a subset of the spots can measure on the wafer are discarded.

Note that the indices for the maps dZx and dRyx go from −N to N. The indices for cw (chuck+wafer) go from −N−4 to N+4, i.e. the same as for the maps but 4 extra at both sides because of the 9 spot level sensor. Finally, the indices for the LS spots go from −4 to 4 (9 spots). Note that xLS,−4 is the x coordinate of the LS spot with number −4.

In order to solve the above set of equations, they can be written in matrix-vector form:

$$\overline{v} = M\overline{p}$$

with e.g.:

$$\overline{v} = \begin{pmatrix} v_1 \\ \vdots \\ v_{(2N+1)*9} \end{pmatrix}, \quad \overline{p} = \begin{pmatrix} dZx_{-N} \\ \vdots \\ dZx_N \\ dRyx_{-N} \\ \vdots \\ dRyx_N \\ cw_{-N-4} \\ \vdots \\ cw_{N+4} \\ dz_{LS,-4} \\ \vdots \\ dz_{LS,4} \end{pmatrix}$$

and with matrix M accordingly.

In order to match the rank of the matrix M, two constraints are added. By matching the rank it is meant varying the rank so that it is equal to or greater than the number of unknowns. Matching the rank can be done in a number of ways, e.g. by adding rows to the matrix to impose a constraint that the average map update equals zero. Another way to impose constraints is to reduce the number of parameters. This method in fact results in column reduction. Alternatively, the columns of the matrix and the components of the vectors may be combined to determine the constraints.

Figure 5:
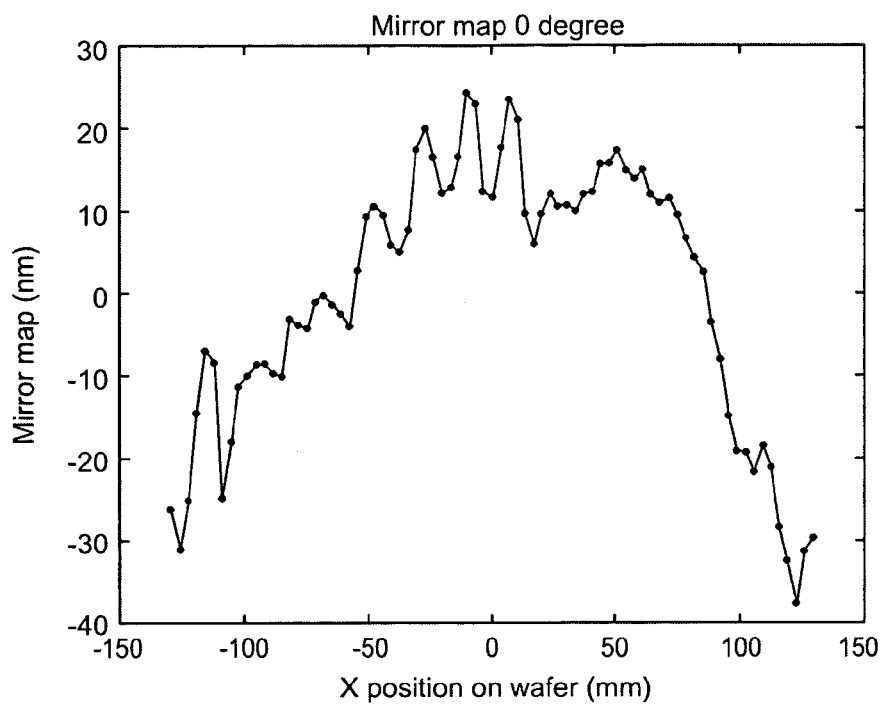
FIG. 5 is a plot of Z position variation versus x position for the measurement mirror of FIGS. 2 and 3, i.e. a mirror map.
Figure 6:
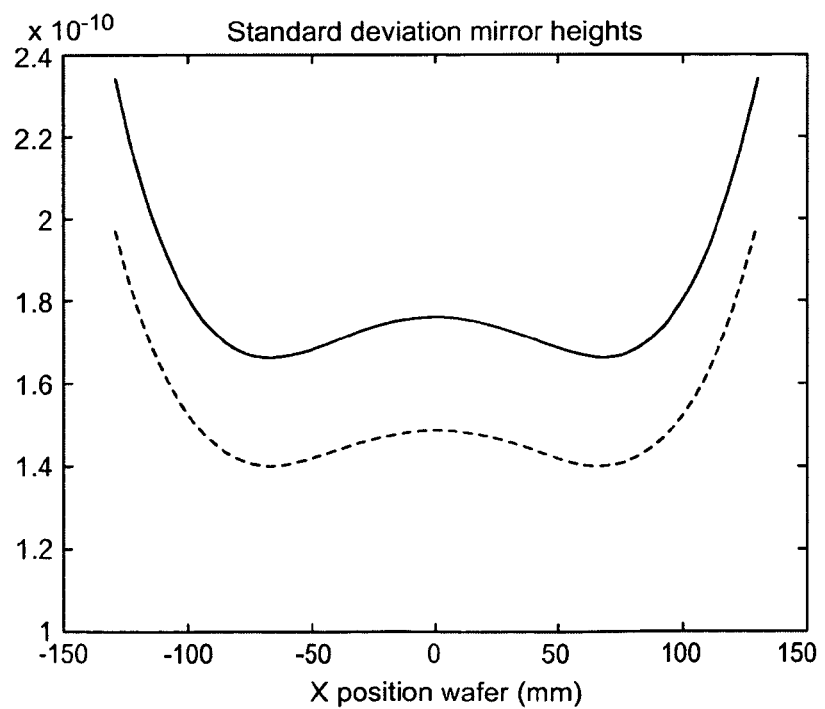
FIG. 6 is a plot of standard deviation mirror heights versus x position.
Figure 7:
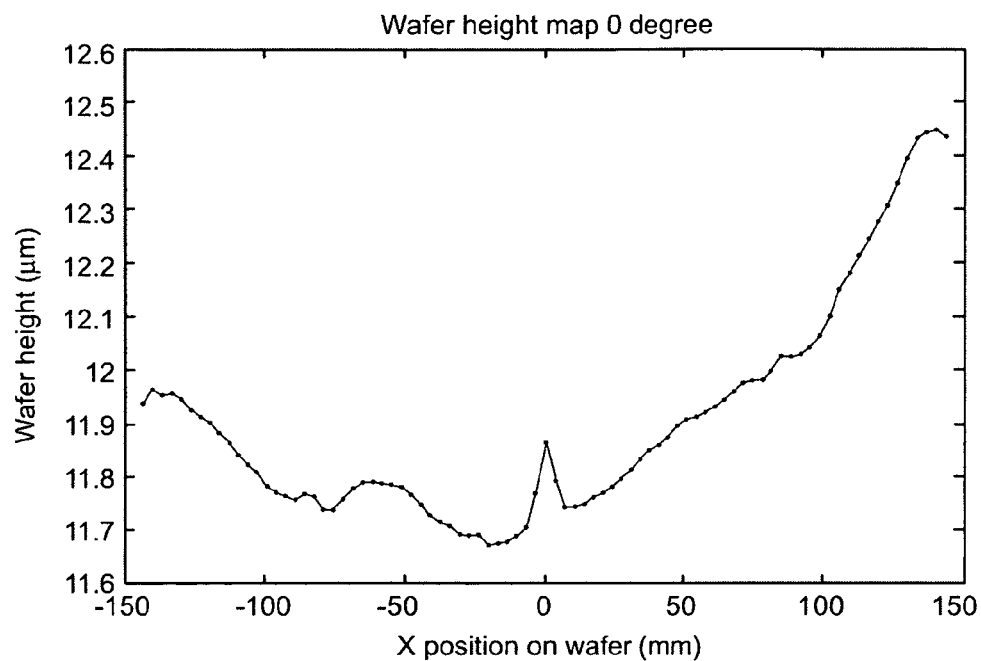
FIG. 7 is a plot of wafer height versus x position.

FIG. 5 shows the mirror map that is obtained if the above equations are solved for the measurement at Y=0 with the wafer orientation 0° (i.e. the normal wafer load orientation). This provides a measure of the z-position error. If an accuracy analysis is performed on the values, the standard deviations shown in FIG. 6 are obtained. From this it can be seen that these values are of the order of a few Ångstrom. This means a 3σ value of approximately 1 nm. This is very accurate. A wafer height map can also be obtained, as shown in FIG. 7. The 3σ values for this are of the same order as the mirror map.

Figure 8:
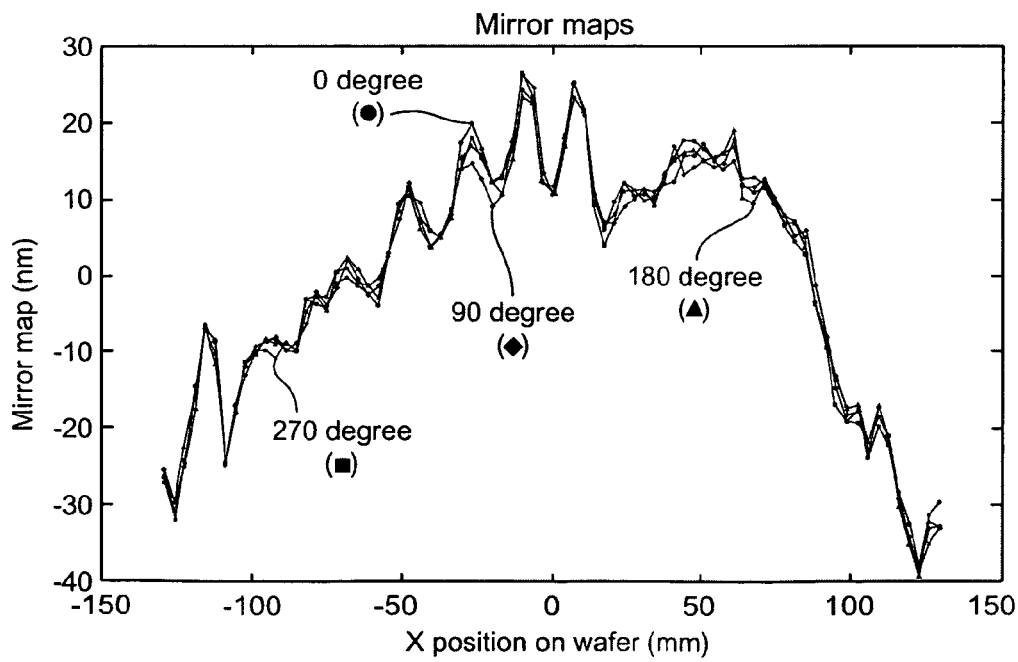
FIG. 8 shows four mirror maps, each mirror map being for a different orientation of the wafer.

The mirror map of FIG. 5 is for measurements taken at a wafer orientation of 0°. To gain a measure of the reproducibility and accuracy, the mirror maps and wafer height maps of three other wafer orientations were calculated, these being 90°, 180° and 270°, although other orientations could equally be used. As will be appreciated, the orientation 180° is identical to the 0° measurement with the exception that the wafer heights are measured in opposite direction. To include this in the calculation, the columns of matrix M describing the wafer height contributions are flipped up-down except for the latter two rows, representing the constraints. This was also done for the orientation of 270°, which is the counterpart of 90°. The results for the mirror maps obtained for the different orientations are shown in FIG. 8. From this, it can be seen that the variation per mirror position found for the four wafer orientations is 3-6 nm. This means that the orientation of the wafer and thus the wafer contribution is properly removed/split from the mirror contribution. It also shows that just one wafer orientation is required to determine the absolute mirror map to within 3-6 nm. The wafer height maps also show a consistent picture as is clear from FIG. 9 which shows that the orientations for 0° and 180° as well as 90° and 270° have the same shape except for a tilt caused by the zeroing error, which is not included in the calculations. From the analysis at Y=0 mm, it is clear that a mirror map can be very reproducibly obtained with a few nm. In principle just one wafer orientation is required to obtain an accurate mirror map.

Based on the mathematics of absolute mirror map analysis described above, it is possible to determine a measure of the wafer table WT or chuck flatness. The analysis of the mirror map shows that it is possible to unravel the mirror and wafer contributions (as well as LS spot offset residuals) using the LS measurements. In this case, the measurements at the two orientations can be expressed as:

For 0 degrees, $$v_1 = dZx_{-N} - x_{LS,-4}dRyx_{-N} + c_{-N-4} + w_{-N-4} + dz_{LS,-4}$$

$$v_2 = dZx_{-N} - x_{LS,-3}dRyx_{-N} + c_{-N-3} + w_{-N-3} + dz_{LS,-3}$$

$$\vdots$$

$$v_9 = dZx_{-N} - x_{LS,4}dRyx_{-N} + c_{-N+4} + w_{-N+4} + dz_{LS,4}$$

$$v_{10} = dZx_{-N+1} - x_{LS,-4}dRyx_{-N+1} + c_{-N-3} + w_{-N-3} + dz_{LS,-4}$$

$$v_{11} = dZx_{-N+1} - x_{LS,-3}dRyx_{-N+1} + c_{-N-2} + w_{-N-2} + dz_{LS,-3}$$

$$\vdots$$

$$v_{18} = dZx_{-N+1} - x_{LS,4}dRyx_{-N+1} + c_{-N+5} + w_{-N+5} + dz_{LS,4}$$

$$\vdots$$

-continued $$v_{2N*9+1} = dZx_N - x_{LS,-4}dRyx_N + c_{N-4} + w_{N-4} + dz_{LS,-4}$$

$$v_{2N*9+2} = dZx_N - x_{LS,-3}dRyx_N + c_{N-3} + w_{N-3} + dz_{LS,-3}$$

$$\vdots$$

$$v_{(2N+1)*9} = dZx_N - x_{LS,4}dRyx_N + c_{N+4} + w_{N+4} + dz_{LS,4}$$

For 180 degrees:

$$v_{P+1} = dZx_{-N} - x_{LS,-4}dRyx_{-N} + c_{-N-4} + w_{N+4} + dz_{LS,-4}$$

$$v_{P+2} = dZx_{-N} - x_{LS,-3}dRyx_{-N} + c_{-N-3} + w_{N+3} + dz_{LS,-3}$$

$$\vdots$$

$$v_{P+9} = dZx_{-N} - x_{LS,4}dRyx_{-N} + c_{-N+4} + w_{N-4} + dz_{LS,4}$$

$$v_{P+10} = dZx_{-N+1} - x_{LS,-4}dRyx_{-N+1} + c_{-N-3} + w_{N+3} + dz_{LS,-4}$$

$$v_{P+11} = dZx_{-N+1} - x_{LS,-3}dRyx_{-N+1} + c_{-N-2} + w_{N+2} + dz_{LS,-3}$$

$$\vdots$$

$$v_{P+18} = dZx_{-N+1} - x_{LS,4}dRyx_{-N+1} + c_{-N+5} + w_{N-5} + dz_{LS,4}$$

$$\vdots$$

$$v_{P+2N*9+1} = dZx_N - x_{LS,-4}dRyx_N + c_{N-4} + w_{-N+4} + dz_{LS,-4}$$

$$v_{P+2N*9+2} = dZx_N - x_{LS,-3}dRyx_N + c_{N-3} + w_{-N-3} + dz_{LS,-3}$$

$$\vdots$$

$$v_{+P(2N+1)*9} = dZx_N - x_{LS,-4}dRyx_N + c_{N+4} + w_{-N+4} + dz_{LS,4}$$

where P=(2N+1)*9. For the 180 degrees case, the wafer indices are reversed with respect to the 0 degrees case. Creating a matrix-vector equation consisting of both sets of measurements enables the chuck and wafer contributions to be distinguished for one line in x direction.

Again, in order to solve the above two set of equations they can be written in matrix-vector form:

$$\bar{v} = M\bar{p}$$

with e.g.:

$$\bar{v} = \begin{pmatrix} v_1 \\ \vdots \\ v_{(2N+1)*9} \\ v_{(2N+1)*9+1} \\ v_{2*(2N+1)*9} \end{pmatrix}, \bar{p} = \begin{pmatrix} dZx_{-N} \\ \vdots \\ dZx_N \\ dRyx_{-N} \\ \vdots \\ dRyx_N \\ c_{-N-4} \\ \vdots \\ c_{N+4} \\ w_{-N-4} \\ \vdots \\ w_{N+4} \\ dz_{LS,-4} \\ \vdots \\ dz_{LS,4} \end{pmatrix}$$

and again with matrix M accordingly.

As an alternative approach, the two sets of equations for 0 and 180 degrees described above can be solved separately. Consequently, the solutions would be:

$$\bar{p}_0 = \begin{pmatrix} dZx_{-N} \\ \vdots \\ dZx_N \\ dRyx_{-N} \\ \vdots \\ dRyx_N \\ c_{-N-4} + w_{-N-4} \\ \vdots \\ c_{N+4} + w_{N+4} \\ dz_{LS,-4} \\ \vdots \\ dz_{LS,4} \end{pmatrix}, \bar{p}_{180} = \begin{pmatrix} dZx_{-N} \\ \vdots \\ dZx_N \\ dRyx_{-N} \\ \vdots \\ dRyx_N \\ c_{-N-4} + w_{N+4} \\ \vdots \\ c_{N+4} + w_{-N-4} \\ dz_{LS,-4} \\ \vdots \\ dz_{LS,4} \end{pmatrix}$$

Subtraction of the two above parameter vectors gives:

$$\bar{p}_0 - \bar{p}_{180} = \begin{pmatrix} \vdots \\ w_{-N-4} - w_{N+4} \\ \vdots \\ w_{n+4} - w_{-N-4} \\ \vdots \end{pmatrix}$$

From this the wafer flatness w-N-4, ..., wN+4 can easily be obtained and consequently, the chuck flatness c-N-4, ..., cN+4 can be determined.

Figure 9:
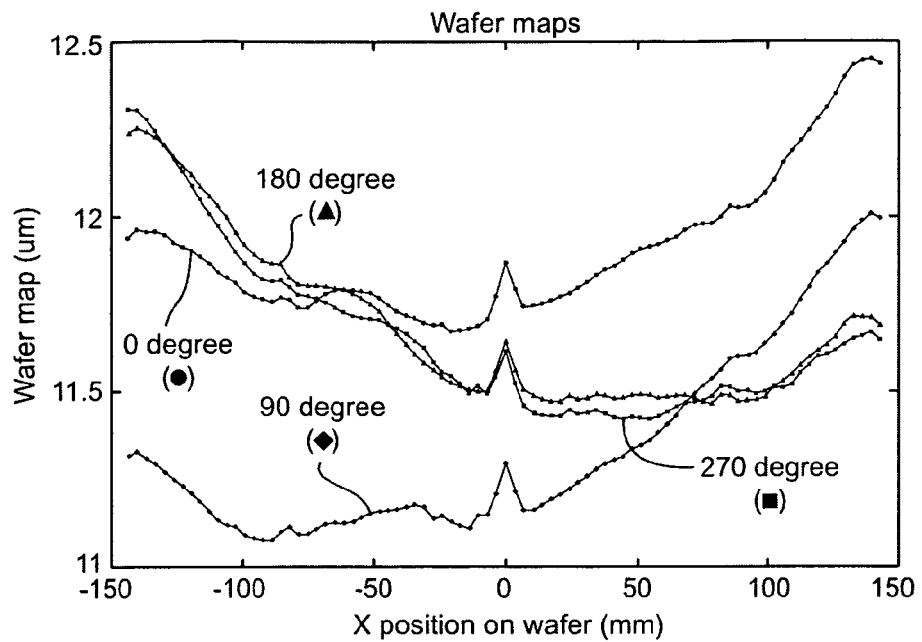
FIG. 9 shows four wafer maps, each wafer map being for a different orientation of the wafer.
Figure 10:
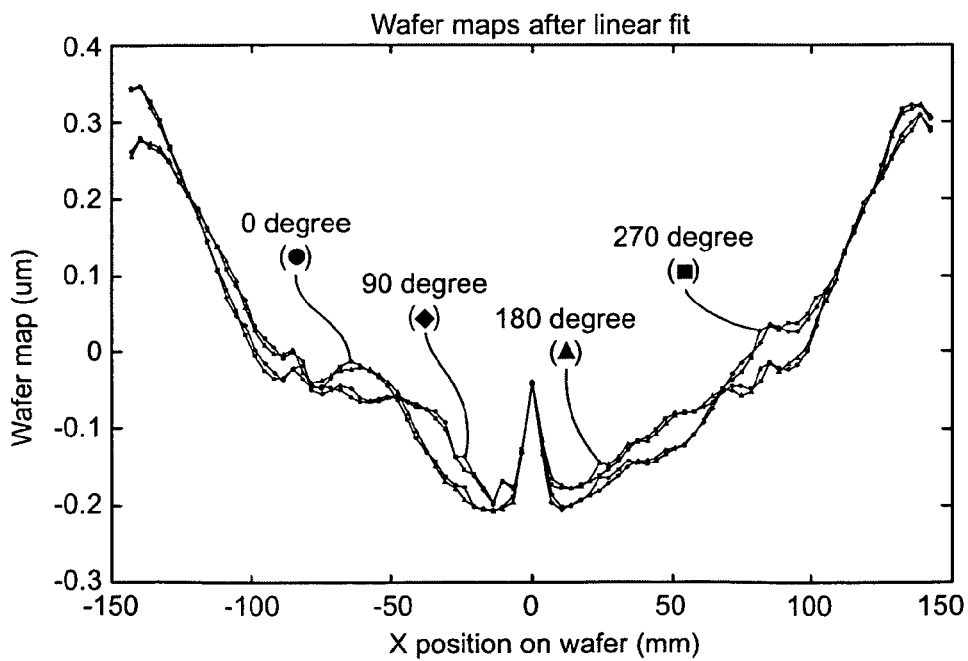
FIG. 10 shows the wafer maps of FIG. 9 after a linear fit.
Figure 11:
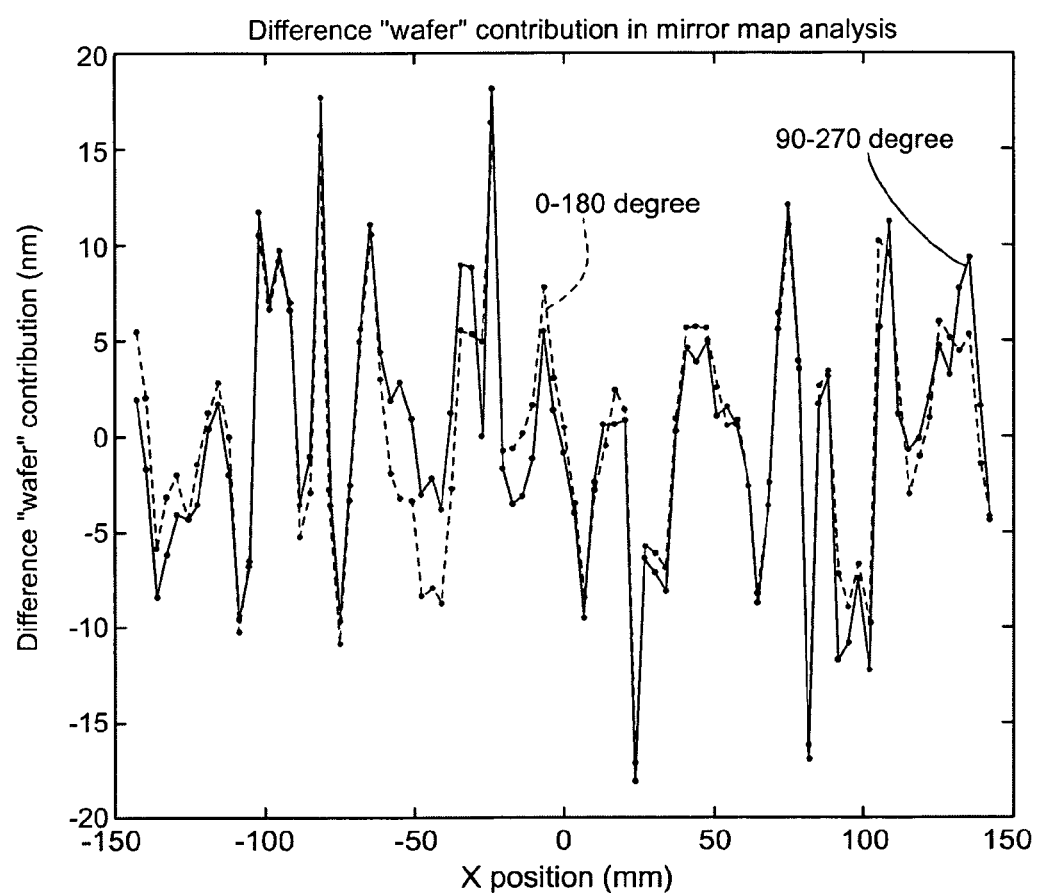
FIG. 11 is a plot of the relative substrate table difference as a function of x position for two wafer orientations.

Before removing the wafer contributions, the zeroing error evident in FIG. 9 has to be corrected for. To do this, a linear fit is subtracted from the wafer height contribution of the vectors. The result after subtracting the linear fit is shown in FIG. 10, which clearly shows that the 0° and 180° as well as the 90° and 270° provide the same global wafer shape at Y=0 mm. The result of the relative chuck differences for 0° and 180° as well as 90° and 270° (which cover the same chuck positions) obtained from the data above is shown in FIG. 11. FIG. 11 of course is, except for the Y-sign, symmetric around X=0. The difference between the relative chuck maps of 0-180 and 90-270 (on Y=0 mm) is of the order of maximum 4-5 nm. This is a good indication of the accuracy with which the wafer height contribution can be determined. As will be appreciated this technique provides only a relative and not an absolute chuck map. Nevertheless, this gives a useful chuck flatness measure.

Figure 12:
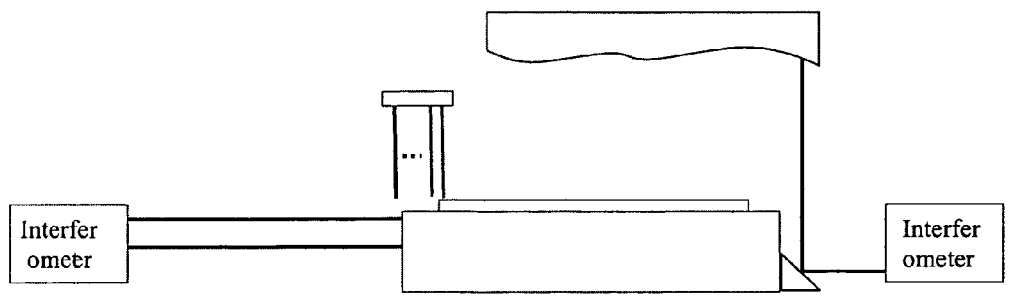
FIG. 12 is an alternative measurement system to that of FIG. 2.

Whilst errors in Ry in the arrangement of FIG. 2 can be compensated for, an alternative arrangement can be used to avoid these occurring in the first place. FIG. 12 shows such as arrangement. As before, this has two interferometers IF, one each on opposite sides of the wafer table WT. In this case, one of the interferometers IF is positioned to direct two beams of measurement radiation onto an X-mirror M1 that is provided on a sidewall of the table. Mirror M1 is substantially perpendicular to the radiation emitted from the interferometer IF. On the other side of the wafer table WT is an angled mirror M2 that is positioned so as to direct radiation onto a Z-mirror. In this arrangement, changes in Ry can be determined by monitoring the lengths of the paths travelled by the two measurement beams that are directed onto M1. By averaging these path lengths, the X position can be found. By calculating the difference between these, a measure of Ry can be found. Changes in Z-position can be determined using the path length of the measurement radiation that is directed onto the Z-mirror. In this case, only the measurement of Z suffers from the effects of mirror unflatness and so calibration of Ry using the overlapping level sensor measurements described previously is not necessary.

The present invention provides an accurate and reproducible technique for determining a measure of Z-position error and/or chuck unflatness, etc. in a lithographic apparatus. This is done by using a plurality of overlapping level measurements. The apparatus and method in which the invention is embodied typically use a computer program or computer program product for implementing the invention, although it will be appreciated that hardware embodiments may be possible. In use, the Z-position error and/or chuck unflatness etc can be used to calibrate the apparatus, thereby to improve performance. Again, this would typically be implemented using some form of computer software.

It will be appreciated that departures from the above-described embodiments may still fall within the scope of the invention. For example, the techniques can be extended to provide additional information, such as by taking measurements at a series of different y positions, and at four or more different wafer load angles, such as 0, 90, 180, and 270. Doing this would allow dZy, dRyy and the height of the wafer and chuck to be distinguished. As before, the following equation can be used as the basis for calculating each of these:

$$v_{meas}(x_{WS},y_{WS}) = dZX(X) + dZy(Y) - x_{LS}dRyx(X) - x_{LS}dRyy(Y) + c_{true}(x_{WS},y_{WS}) + w_{true}(x_{waf},y_{waf}) + dZ_{LS}(x_{LS})$$

In addition, this would allow the height of the wafer and chuck to be determined across substantially the whole wafer and chuck surfaces, so as to provide a two dimensional map. For this case, it is possible to present the different measurements in a set of equations. Given the very large number of measurements and large number of parameters, this is omitted for the sake of clarity.

Furthermore, although the invention has been described with reference to an apparatus in which the substrate table position measurement system is interferometer based and includes a Z-mirror, it could be applied to any other position measurement system in which movement of the substrate table has an impact on the Z-position measured. As an example, the present invention could be applied to an encoder based positioning system as described in co-pending U.S. patent applications Ser. No. 10/769,992 and U.S. Ser. No. 10/899,295, the contents of which are fully incorporated herein by reference.

Figure 13:
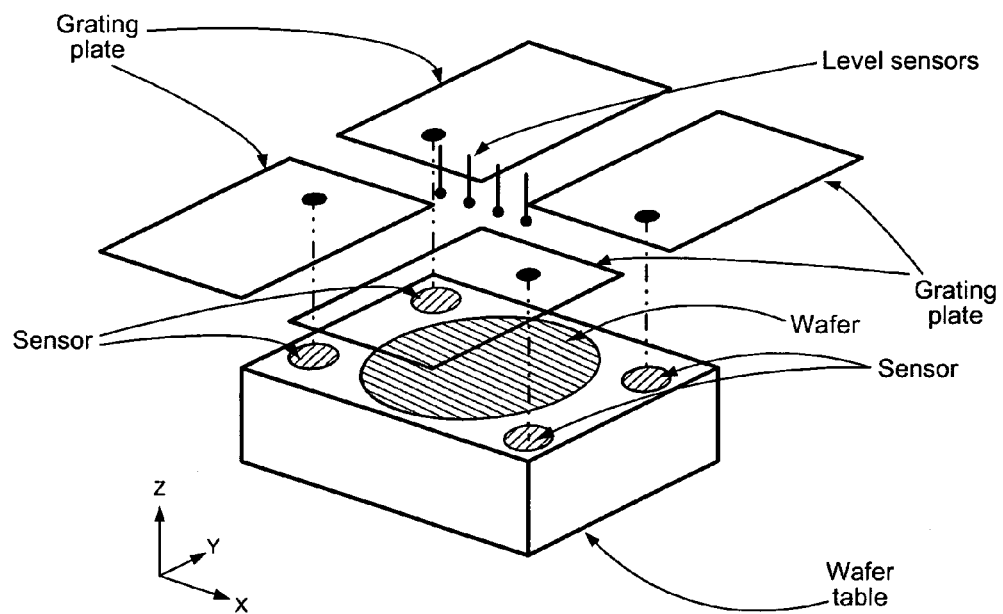
FIG. 13 is an example of an encoder system for measuring the position and inclination of a wafer table.

FIG. 13 shows an example of an encoder-based system with which the present invention can be used. In this, grating plates are mounted in fixed positions above the wafer table. Sensors are mounted to the wafer table. Here, the term 'encoder' refers to a grating plate and sensor pair. Each sensor determines one or more components of its position with respect to one grating plate. In essence, the sensors are interferometers mounted to the wafer table and the grating plates are the equivalent of the mirrors described previously. Due to their diffractive properties, light incident on the grating plates is subject to a phase change. The detected phase change depends not only on the light path length, but also on the XY-position at which the sensing/interferometer beam hits the grating plate. As a result the detected phase depends on XY and Z. The angle of incidence of the sensing radiation may be perpendicular to the grating plate, although this is not essential.

As before, mounted above the wafer is a level sensor array. Given a proper choice of the components to be measured by each sensor, the position and inclination of the wafer table with respect to the fixed world can be determined by combining the results of the individual sensors, the position and inclination of the grating plates with respect to the fixed world and the position and inclination of the sensors with respect to the wafer table. Thus, by causing relative movement between the level sensor array and the wafer table, typically by moving the wafer table along the X-axis, the same measurement principles as described previously can be used to determine Z, and if necessary Ry, deviations of the wafer table position for each x-position. It should be noted that in practice, it is not necessary to know exactly the wafer table position with respect to the fixed world. A less strict requirement is that the wafer table can be positioned in a 3-dimensional orthogonal grid. However, to achieve this the mutual relative position and inclination of the grating plates must be known.

In another variation on the described arrangement, whilst the level sensor array shown in FIGS. 2, 3, 12 and 13 is one-dimensional, it will be appreciated that a two dimensional array/arrangement could be used, although this would increase the computational complexity. Also, whilst specific reference is made to the use of lithographic apparatus in the manufacture of ICs, it should be understood that the lithographic apparatus may have other applications, such as the manufacture of integrated optical systems, guidance and detection patterns for magnetic domain memories, liquid crystal displays (LCDs), thin film magnetic heads, etc. It should be appreciated that in the context of such alternative applications, any use of the terms "wafer" herein may be considered synonymous with the more general term "substrate". In addition, the substrate referred to herein may be processed before or after exposure, in for example, a track (a tool that typically applies a layer of resist to a substrate and develops the exposed resist) or a metrology or inspection tool. Furthermore, the substrate may be processed more than once, for example, in order to create a multi-layer IC, so that the term substrate used herein may also refer to a substrate that already contains multiple processed layers. Also, while the lithographic apparatus described includes a reflective reticle and a projection system including reflective elements, a transmissive reticle and/or elements in the projection system may also be used. Furthermore, the apparatus has been described for use with EUV radiation but it will be appreciated that radiation of other wavelengths may also be used. Hence, while specific embodiments of the invention have been described above, it will be appreciated that the invention may be practiced otherwise than as described. The description is not intended to limit the invention.

We claim:

1. A lithographic projection apparatus comprising:
   a substrate table configured to hold a substrate, the substrate table defining a Z-direction substantially perpendicular to a surface of the substrate table that is configured to hold the substrate;
   a plurality of level sensors for sensing a level of a substrate carried on the substrate table at a plurality of different positions, to determine coordinates of the substrate along the Z-direction;
   a system for determining the position of the substrate table in at least the Z-direction;
   a controller configured to cause relative movement between the substrate table and the plurality of level sensors, so that each of the plurality of the level sensors is able to assume a first position relative to the substrate to make a measurement at a first measurement point on the substrate, thereby to provide a first set of overlapping measurements, and so that each of the plurality of level sensors is able to assume a second position relative to the substrate to make a measurement at a second measurement point on the substrate, thereby to provide a second set of overlapping measurements; and
   a calculator for calculating at least one of a measure of position errors, a measure of substrate table unflatness and a measure of the level sensor position/offset using the first and second sets of overlapping measurements and position determinations from said system for determining the position of the substrate table.

2. An apparatus as claimed in claim 1, wherein the system for determining the position of the substrate table in at least the Z-direction includes a Z-mirror.

3. An apparatus as claimed in claim 1, wherein the system for determining the position of the substrate table in at least the Z-direction includes an encoder.

4. An apparatus according to claim 1, wherein the controller is configured to cause relative movement of an amount that corresponds substantially to a pitch of the plurality of level sensors.

5. An apparatus according to claim 1, wherein the controller is configured to cause relative movement in an X-direction which is perpendicular to the Z-direction, and the level sensors are operable to take measurements at each of a plurality of X-positions along the X-direction.

6. An apparatus according to claim 5, wherein the measurements are taken at two or more different substrate load orientations.

7. An apparatus according to claim 1, wherein the controller is configured to cause relative movement in X and Y directions, wherein the X-direction and Y-direction are mutually orthogonal and perpendicular to the Z-direction, and the level sensors are operable to take measurements at each of a plurality of X-positions along the X-direction and each of a plurality of Y positions along the Y-direction.

8. An apparatus according to claim 7, wherein said controller is configured so that overlapping measurements are taken at two or more different substrate load orientations.

9. An apparatus according to claim 1, wherein the system for determining the position of the substrate table is an interferometer system.

10. An apparatus according to claim 1, further comprising a volume radiating source.

11. An apparatus according to claim 1, further comprising a plasma radiation source.

12. An apparatus according to claim 1, wherein the position errors are any one or more of Z-position, Y-position, X-position, rotational position relative to the X-axis and rotational position relative to the Y-axis, wherein the X-axis and Y-axis are mutually orthogonal axes and are perpendicular to the Z-direction, and wherein the Z-position is determined with respect to the Z-direction, the Y-position is determined along the Y-axis, and the X-position is determined along the X-axis.

13. An apparatus according to claim 1, further comprising a support configured to support a patterning device, the patterning device configured to impart a beam of radiation with a pattern in its cross section and a projection system configured to project the patterned radiation onto a target portion of the substrate.

14. A method for measuring mirror flatness and/or chuck flatness in a lithographic system that has a substrate table configured to hold a substrate, the substrate table defining a Z-direction substantially perpendicular to a surface of the substrate table that is configured to hold the substrate; a plurality of level sensors for sensing a level of a substrate carried on the substrate table at a plurality of different positions, to determine coordinates of the substrate along the Z-direction, and a system for determining the position of the substrate table in at least the Z-direction, the method comprising:

generating relative movement between the substrate table and the plurality of level sensors, so that each of the plurality of the level sensors is able to assume a first position relative to the substrate to make a measurement at a first measurement point on the substrate, to provide a first set of overlapping measurements, and so that each of the plurality of level sensors is able to assume a second position relative to the substrate to make a measurement at a second_measurement point on the substrate, to provide a second set of overlapping measurements; and determining at least one of a measure of position errors, substrate table unflatness or a measure of the level sensor position/offset using the first and second sets of overlapping measurements and position determinations from the system for determining the position of the substrate table.

15. A method as claimed in claim 14, wherein the relative movement is of an amount that corresponds to a pitch of the plurality of level sensors, thereby providing measurement overlap.

16. A method as claimed in claim 15, wherein the system for determining the position of the substrate table in at least the Z-direction includes a Z-mirror, and each level sensor measurement is a function of Z-mirror height, substrate height and level sensor spot offset error.

17. A method as claimed in claim 15, wherein the system for determining the position of the substrate table in at least the Z-direction includes an encoder and each level sensor measurement is a function of the height of at least part of the encoder, substrate height and level sensor spot offset error.

18. A method as claimed in claim 15, wherein calculating at least one of position errors, substrate table unflatness and level sensor position/offset involves solving simultaneous equations by transforming them into a matrix format.

19. A method according to claim 14, wherein the position errors are any one or more of Z-position, Y-position, X-position, rotational position relative to the X-axis and rotational position relative to the Y-axis, wherein the X-axis and Y-axis are mutually orthogonal axes and are perpendicular to the Z-direction, and wherein the Z-position is determined with respect to the Z-direction, the Y-position is determined along the Y-axis, and the X-position is determined along the X-axis.

20. A method according to claim 14, wherein the overlapping measurements are taken at a plurality of different wafer load angles.

21. A method according to claim 14, wherein the overlapping measurements are taken at a plurality of different Y positions, wherein each of the Y positions is defined with respect to a Y-axis that is orthogonal to the Z-direction.

22. A method according to claim 14, wherein the lithographic system includes a support configured to support a patterning device, the patterning device configured to impart a radiation beam with a pattern in its cross section and a projection system configured to project the patterned radiation onto a target portion of the substrate.

23. The method according to claim 14, wherein the at least one of the measure of position errors, the measure of substrate table unflatness or the measure of level sensor position/offset are used to calibrate the lithographic system.

24. The method according to claim 14, wherein at least one of the measure of position error, the measure of substrate table unflatness or the measure of level sensor position/offset in the lithographic system enable using sets of overlapping level sensor measurements, each set comprising measurements taken by the plurality of level sensors at substantially the same position, wherein different sets comprise measurements taken at different positions.

25. A computer program on at least one physical, computer-readable medium, the computer program having code or instructions for determining mirror and/or chuck flatness, the code or instructions for performing the method of:

generating relative movement between a substrate table and a plurality of level sensors, so that each of the plurality of the level sensors is able to assume a first position relative to the substrate to make a measurement at a first measurement point on the substrate, to provide a first set of overlapping measurements;

generating relative movement between the substrate table and the plurality of level sensors, so that each of the plurality of the level sensors is able to assume a second position relative to the substrate to make a measurement at a second measurement point on the substrate, to provide a second set of overlapping measurements; and determining at least one of a measure of position errors, substrate table unflatness or a measure of the level sensor position/offset using the first and second sets of overlapping measurements.

* * * * *